United States Patent [19]

Lee et al.

[11] Patent Number: 6,001,743

[45] Date of Patent: Dec. 14, 1999

[54] METHOD FOR FABRICATING A SELF-ALIGNED CONTACT

[75] Inventors: Jia-Hwa Lee, Taipei; Chia-Wen Liang, Hsinchu Hsien, both of Taiwan

[73] Assignee: United Microelectronics Corp., Hsinchu, Taiwan

[21] Appl. No.: 09/149,736

[22] Filed: Sep. 8, 1998

[30] Foreign Application Priority Data

Jun. 17, 1998 [TW] Taiwan .................................. 87109655

[51] Int. Cl.$^6$ .................................................. H01L 21/00
[52] U.S. Cl. ............................ 438/706; 216/17; 216/18; 216/39; 438/713; 438/734; 438/745
[58] Field of Search .................................... 438/692, 706, 438/713, 723, 724, 734, 743, 744, 750, 756, 757, 745; 216/17, 18, 39, 57, 79, 83, 67

[56] References Cited

U.S. PATENT DOCUMENTS

| | | | |
|---|---|---|---|
| 5,262,346 | 11/1993 | Bindal et al. ........................ | 438/692 X |
| 5,318,663 | 6/1994 | Buti et al. ............................ | 438/692 X |
| 5,502,008 | 3/1996 | Hayakawa et al. ................. | 438/692 X |
| 5,575,885 | 11/1996 | Hirabayashi et al. .............. | 438/692 X |

*Primary Examiner*—William Powell
*Attorney, Agent, or Firm*—Hickman Stephens & Coleman, LLP

[57] ABSTRACT

A method for minimizing the dimension of a contact forms a thick dielectric layer on a provided substrate first, and then forms a contact on the first dielectric layer and expose the substrate by performing a slope etching process. The contact with the target contact size is obtained by partially removing the thick dielectric layer. Since the target contact size is obtained by a self-aligned method, the upper diameter of the contact is not limited by a conventional fabrication process. Furthermore, after a contact is formed, it is optional to fill the contact with filler. Even after a desired contact is formed in the case that filler is used, the remains of the filler can be either kept or removed depending on the conductivity of the filler.

10 Claims, 3 Drawing Sheets

METHOD FOR FABRICATING A SELF-ALIGNED CONTACT

CROSS-REFERENCE TO RELATED APPLICATION

This application claims the priority benefit of Taiwan application serial no. 87109655, filed Jun. 17, 1998, the full disclosure of which is incorporated herein by reference.

BACKGROUND OF THE INVENTION

1. Field of the Invention

This invention relates to a method for fabricating a semiconductor device, and more particularly, to a fabricating method that applies a self-aligned process to minimize the dimension of a contact.

2. Description of Related Art

The design of multilevel interconnects has been widely applied in the semiconductor fabrication process for integrating more interconnects within a limited area on a semiconductor chip due to the downsizing of the design rule. As the dimensions and features of an integrated circuit become more complex and smaller, the requirement on the overlay accuracy between layers is stricter.

As shown in FIG. 1, a cross-sectional view showing a conventional contact, a dielectric layer 104 which is k thick is formed on a provided semiconductor substrate 100, wherein the substrate 100 further contains an active area 102 formed therein. Conventionally, a conducting line (not shown) is electrically connected to the active area 102 in the substrate 100 through a contact 106, wherein the contact 106 has a lower diameter d on the end connected to the active area 102, and a upper diameter D on the other end. For example, the lower diameter d used in a dynamic random access memory (DRAM) with a 0.21 $\mu$m line width is about 0.15 $\mu$m.

Since a contact hole is filled with conducting material to make the contact 106 an electrical connection, the thickness of the dielectric layer 104 therefore is limited by the aspect ratio set by the follow-up process. The aspect ratio determines the maximum thickness of the dielectric layer at which a certain diameter of contact hole will still allow conducting material to be filled into the contact hole without difficulty. In order to form a contact with a lower diameter d of about 0.15 $\mu$m in a dielectric 104 with a thickness of about 0.6 $\mu$m, an etching process is normally performed on the dielectric layer 104. For example, if an etching process is performed on the dielectric layer 104 to form the contact hole 106 with an etching angle of about 85°, the upper diameter D of the contact hole 106 is supposed to be about 0.26 $\mu$m. Because the dimension of the contact hole after the etching process is wider than after the exposure process due to the extension rule, the after development inspection (ADI) diameter required for the foregoing contact hole is about 0.23 $\mu$m, which is too small for a conventional fabrication process.

SUMMARY OF THE INVENTION

It is therefore an objective of the present invention to provide a fabricating method that applies a self-aligned and slope etching process to minimize the dimension of a contact easily, so that the thickness of the dielectric layer is no longer limited by the aspect ratio of the follow-up process.

In accordance with the foregoing objective of the present invention, the fabricating method according to the invention that applies a self-aligned process to minimize the dimension of a contact includes forming a thick dielectric layer on the substrate. The thick dielectric layer contains a patterned contact, which is wider than the target contact size, formed by performing a slope etching process to expose the substrate. A layer of filler is then formed on the dielectric layer and is etched back to a certain depth. Then, an etching process is performed on the dielectric layer by using the top surface of the filler within the contact as an etching stop. By using a self-aligned method, the diameter of the contact on the top surface of the dielectric layer matches the target contact size, wherein the remaining filler can be either removed or left. Therefore, a contact with a smaller dimension can be obtained without being limited by the current fabrication process.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method that applies a self-aligned process to minimize the dimension of a contact. FIGS. 2A through 2F are cross-sectional views showing the fabrication process of a contact in a preferred embodiment according to the invention.

Figure 1:
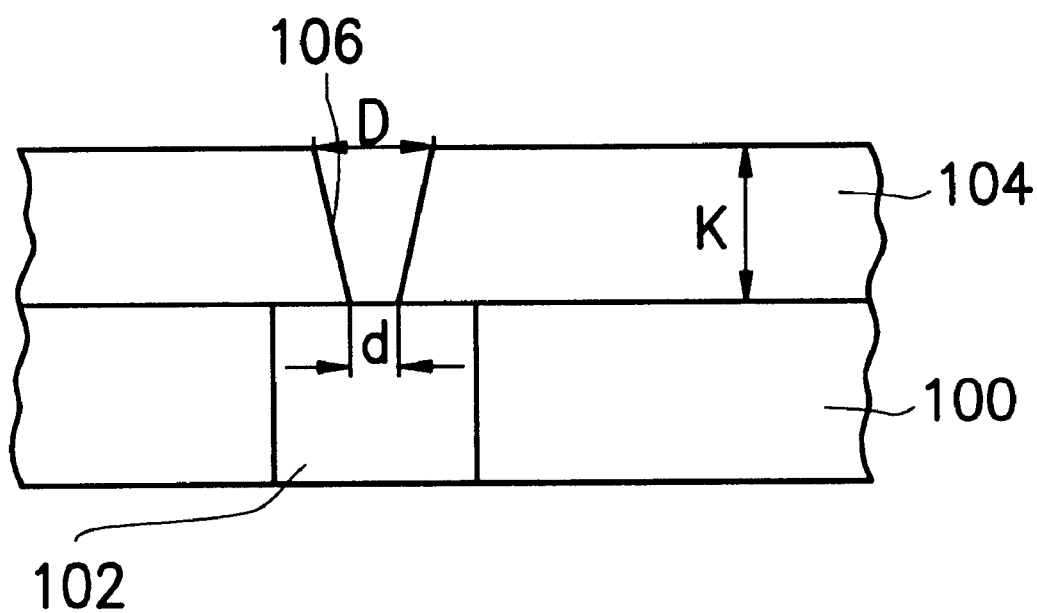
FIG. 1 is a cross-sectional view showing the architecture of a conventional contact.
Figure 2A:
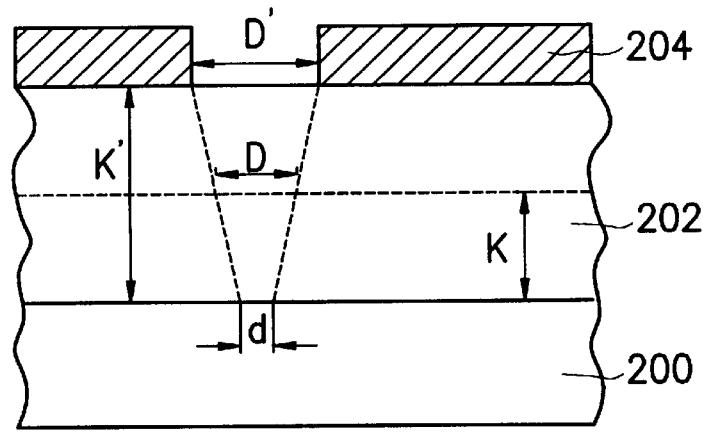
FIGS. 2A through 2F are cross-sectional views showing the fabrication process of a contact in a preferred embodiment according to the invention.

FIG. 2A shows a first dielectric layer 202 that is thick K' and is formed on a provided substrate 200, wherein the first dielectric layer 202 includes an insulator. Then, a mask 204 is used to defined a pattern on the first dielectric layer 202, wherein the pattern includes a contact of a diameter equal to D', and wherein D' is bigger than the target contact size D. The thickness K' of the first dielectric layer 202 is thinned later on, by a follow-up etching process, into a desired thickness K. By referring to the target contact size, the lower diameter d of the contact, the desired thickness K, and the minimum contact diameter available to the current technique, the thickness of the first dielectric layer 202 K' is determined.

Figure 2B:
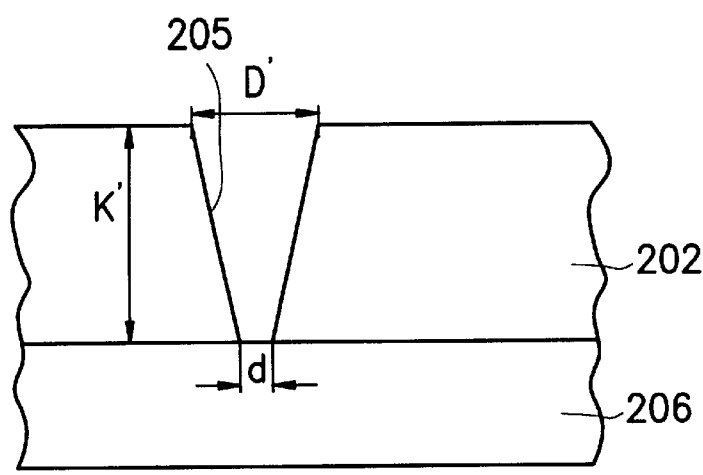

In FIG. 2B, a slope etching process is performed to remove a part of the first dielectric layer 202 and expose the substrate 200. The slope etching process also forms a contact 205 with a upper opening of a diameter equal to D' and a lower opening of a diameter equal to d. The mask 204 is removed after the etching process.

Figure 2C:
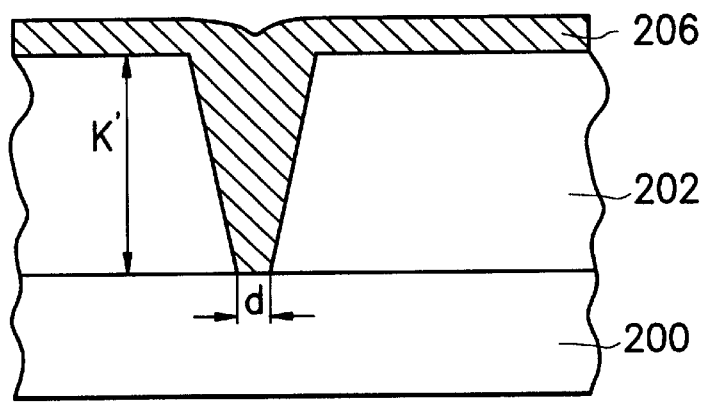

FIG. 2C shows formation of a filler layer 206 on the first dielectric layer 202. Filler layer 206 fills the contact 205.

Figure 2D:
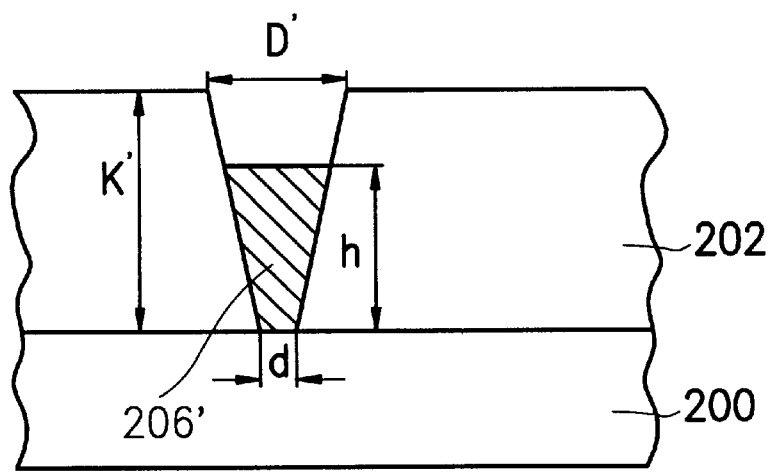

In FIG. 2D, the redundant portion of filler layer 206 deposited on the top surface of the first dielectric layer 202 is removed by a selective etching process. The filler layer 206 located within the contact 205 is partially removed as well, such that the remains of the filler layer 206 within the contact 205, the filler layer 206', is h thick. h is equal to or slightly greater than K. The performed etching process includes a wet etching process or a dry etching process.

Figure 2E:
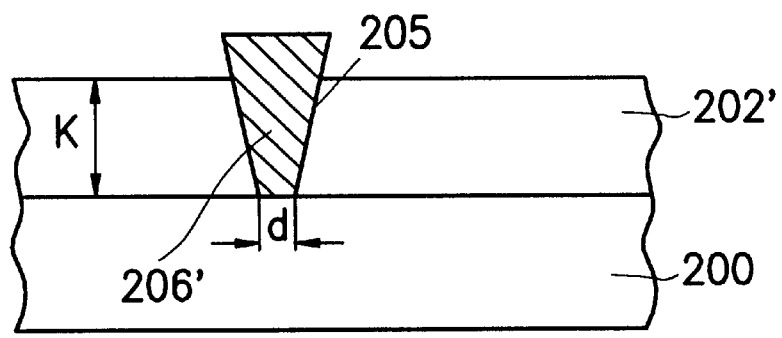

In FIG. 2E, by using the filler layer 206' as an etching stop, a part of the first dielectric layer 202 is selectively removed by a dry etching or a wet etching process. The remains of the first dielectric layer 202, the second dielectric layer 202', is K thick. The desired upper diameter of the contact 205 D is defined by a self-aligned method during the etching process. If the filler layer 206' used includes a conducting material, such as metals, polysilicon, or any other conducting materials, it remains in the contact 205, otherwise, the remains of the filler layer 206', such as a high-resistance material is removed from the contact 205 by a follow-up process.

Figure 2F:
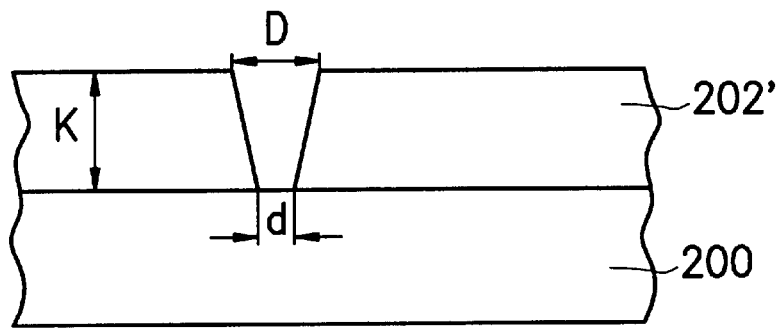

If a dry etching process is performed on the first dielectric layer 202 to form the contact 205 as shown in FIG. 2B, it is not necessary to perform the process shown in FIGS. 2C through 2E. A contact 205 as shown in FIG. 2F can be obtained by continuously performing another dry etching process directly to remove part of the first dielectric layer 202.

The invention provides a new fabricating method that applies a self-aligned process for minimizing the dimension of a contact that forms a thick dielectric layer on a provided substrate first, and then forms a contact and exposes the substrate by performing a slope etching process. The contact with the target contact size is obtained by partially removing the thick dielectric layer. Since the target contact size is obtained by a self-aligned method, the upper diameter of the contact is not limited by a conventional fabrication process.

Furthermore, after a contact is formed, filling the contact with filler is optional. Even after a desired contact is formed in the case that filler is used, the remains of the filler can be either kept or removed depending on the conductivity of the filler.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabricating method for minimizing an upper dimension of a contact, the method comprising:

providing a semiconductor substrate;

forming a first dielectric layer on the substrate;

patterning the first dielectric layer to form a pattern, wherein the pattern contains a contact;

performing a slope etching process to form the contact and expose the substrate; and removing a portion of the first dielectric layer to form a second dielectric layer, wherein the second dielectric layer contains a contact with a target contact size.

2. The method of claim 1, wherein the first dielectric layer includes an insulator.

3. The method of claim 1, wherein the contact size on the first dielectric layer is larger than the target contact size.

4. A fabricating method for minimizing a upper dimension of a contact, the method comprising:

providing a semiconductor substrate;

forming a first dielectric layer on the substrate;

patterning the first dielectric layer to form a pattern, wherein the pattern contains a contact;

performing a slope etching process to form the contact and expose the substrate; and forming a filler layer on the first dielectric layer and in the contact;

selectively removing a portion of the filler layer, wherein the remaining filler layer of a first thickness is only located within the contact; and removing a portion of the first dielectric layer to form a second dielectric layer of a second thickness.

5. The method of claim 4, wherein the filler layer includes metal.

6. The method of claim 4, wherein the filler layer includes polysilicon.

7. The method of claim 4, wherein the filler layer includes an insulator.

8. The method of claim 7, wherein the step of forming the second dielectric layer is followed by removing the remaining filler layer from the contact.

9. The method of claim 4, wherein the first thickness is thicker than the second thickness.

10. The method of claim 4, wherein the first thickness equals the second thickness.

* * * * *